(12) United States Patent
Solomko

(10) Patent No.: US 9,322,858 B2
(45) Date of Patent: Apr. 26, 2016

(54) SYSTEM AND METHOD FOR A PHASE DETECTOR

(71) Applicant: Infineon Technologies AG, Neubiberg (DE)

(72) Inventor: Valentyn Solomko, Munich (DE)

(73) Assignee: Infineon Technologies Austria AG, Neubiberg (DE)

( * ) Notice: Subject to any disclaimer, the term of this patent is extended or adjusted under 35 U.S.C. 154(b) by 94 days.

(21) Appl. No.: 14/172,675

(22) Filed: Feb. 4, 2014

(65) Prior Publication Data

US 2015/0219701 A1 Aug. 6, 2015

(51) Int. Cl.
*H03D 13/00* (2006.01)
*G01R 25/00* (2006.01)

(52) U.S. Cl.
CPC ............. *G01R 25/00* (2013.01); *H03D 13/00* (2013.01)

(58) Field of Classification Search
CPC ....... G01R 25/00; G01R 25/005; H03D 13/00
USPC .................................... 327/2, 3, 12
See application file for complete search history.

(56) References Cited

U.S. PATENT DOCUMENTS

| | | | |
|---|---|---|---|
| 6,029,051 A | 2/2000 | Osterberg et al. | |
| 6,034,554 A * | 3/2000 | Francis et al. | 327/7 |
| 6,329,880 B2 | 12/2001 | Akiya | |
| 6,600,307 B2 | 7/2003 | Turski et al. | |
| 6,803,818 B2 | 10/2004 | van Amerom | |
| 6,879,918 B2 | 4/2005 | Daoud et al. | |
| 7,190,934 B2 | 3/2007 | Kataoka et al. | |
| 7,359,681 B2 | 4/2008 | Cho | |
| 7,375,603 B2 | 5/2008 | Dupont et al. | |
| 7,440,731 B2 | 10/2008 | Staudinger et al. | |
| 7,576,626 B2 | 8/2009 | Gorbachov | |
| 7,821,273 B2 | 10/2010 | Van Bezooijen et al. | |
| 7,907,032 B2 | 3/2011 | Yamamoto et al. | |
| 8,326,234 B2 | 12/2012 | Bakalski et al. | |
| 8,606,198 B1 | 12/2013 | Wright | |
| 8,634,511 B2 | 1/2014 | Hong et al. | |
| 8,830,110 B1 * | 9/2014 | Choi et al. | 341/166 |
| 8,907,702 B1 | 12/2014 | Solomko et al. | |
| 2002/0000866 A1 | 1/2002 | Weiss et al. | |

(Continued)

FOREIGN PATENT DOCUMENTS

| DE | 102010040290 A1 | 3/2011 |
|---|---|---|
| DE | 102010009104 | 8/2011 |

(Continued)

OTHER PUBLICATIONS

"Directional Couplers," Microwave Encyclopedia, Microwaves101.com, Updated May 12, 2013, 5 pages.

(Continued)

*Primary Examiner* — William Hernandez
(74) *Attorney, Agent, or Firm* — Slater & Matsil, L.L.P.

(57) ABSTRACT

In accordance with an embodiment, a method of detecting a phase difference between a first signal and a second signal include latching a state of the first signal using the second signal as a clock to produce a first latched signal, latching a state of the second signal using the first signal as a clock to produce a second latched signal summing the first latched signal and the second latched signal to produce an indication of whether the first signal is leading or lagging the second signal.

25 Claims, 11 Drawing Sheets

(56) References Cited

U.S. PATENT DOCUMENTS

| | | |
|---|---|---|
| 2002/0067786 A1* | 6/2002 | Tomofuji et al. ............. 375/355 |
| 2002/0113601 A1 | 8/2002 | Swank, II |
| 2002/0127990 A1 | 9/2002 | Bollenbeck |
| 2009/0128255 A1 | 5/2009 | Dupont et al. |
| 2009/0302959 A1 | 12/2009 | Belot et al. |
| 2010/0019983 A1 | 1/2010 | Bonnet et al. |
| 2010/0022203 A1 | 1/2010 | Bonnet et al. |
| 2011/0199100 A1 | 8/2011 | Charley et al. |
| 2012/0001693 A1 | 1/2012 | Magoon et al. |
| 2013/0038387 A1 | 2/2013 | Schmidhammer et al. |
| 2013/0147535 A1 | 6/2013 | Hur et al. |
| 2015/0002146 A1 | 1/2015 | Solomko et al. |
| 2015/0035545 A1 | 2/2015 | Langer et al. |
| 2015/0091668 A1 | 4/2015 | Solomko et al. |

FOREIGN PATENT DOCUMENTS

| | | |
|---|---|---|
| DE | 102013212862 A1 | 1/2014 |
| JP | 2010021686 A | 1/2010 |
| KR | 1020050094950 | 9/2005 |
| KR | 1020120082106 A | 7/2012 |
| KR | 1020130070442 A | 6/2013 |

OTHER PUBLICATIONS

Bahl, "Chapter 12 Lumped-Element Circuits," Artechhouse, Jun. 7, 2003, 42 pages.

Dehaene, W. et al., "A 100 MHz Highly Accurate CMOS Zero-Phase Detector for Timing Recovery Systems," ESSCIRC, Sep. 19-21, 1995, pp. 258-261.

Rubin, "A Wide-Band UHF Logarithmic Amplifier," IEEE Journal of Solid-State Circuits, vol. SC-1, No. 2, Dec. 1966, pp. 74-81.

Tang et al., "S-Band Full 360° High Precision Phase Detector," Proceedings of APMC 2012, Kaohsiung, Taiwan, Dec. 4-7, 2012, pp. 97-99.

* cited by examiner

SYSTEM AND METHOD FOR A PHASE DETECTOR

TECHNICAL FIELD

The present disclosure relates generally to an electronic device, and more particularly to a system and method for a phase detector.

BACKGROUND

Directional couplers, which are electronic devices that can detect power being transmitted in a particular direction, are used in a wide variety of radio frequency (RF) circuits. For example, a directional coupler may be used in a radar system to detect a reflected wave by separating the indecent wave from the reflected wave, or may be used in a circuit that measures the impedance mismatch of transmission lines. Functionally, a directional coupler has a forward transmission path and a coupled transmission path. The forward transmission path generally has a low loss, while the coupled transmission path couples a fraction of the transmission power that is propagated in a particular direction. There are many different types of coupler architectures that include electromagnetic couples and magnetic couplers. Each of these coupler types may be implemented using different topologies and materials depending on the frequency of operation and the operational environment.

For example, a directional coupler may be implemented using stripline structures disposed on a printed circuit board (PCB) or transformers. In some stripline implementations, various circuit elements may be as long as a quarter wavelength of the particular signal being measured. For applications that operate at frequencies between 500 MHz and 3.8 GHz, which covers the frequency range at which many cellular telephones operate, constructing stripline directional couplers on an integrated circuit becomes challenging dues to the wavelengths at these frequencies being much longer than the feature sizes on the integrated circuit. Low-loss magnetic-based directional couplers also are challenging to construct at this range of frequencies because of transformer losses and parasitics.

SUMMARY OF THE INVENTION

In accordance with an embodiment, a method of detecting a phase difference between a first signal and a second signal include latching a state of the first signal using the second signal as a clock to produce a first latched signal, latching a state of the second signal using the first signal as a clock to produce a second latched signal summing the first latched signal and the second latched signal to produce an indication of whether the first signal is leading or lagging the second signal.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
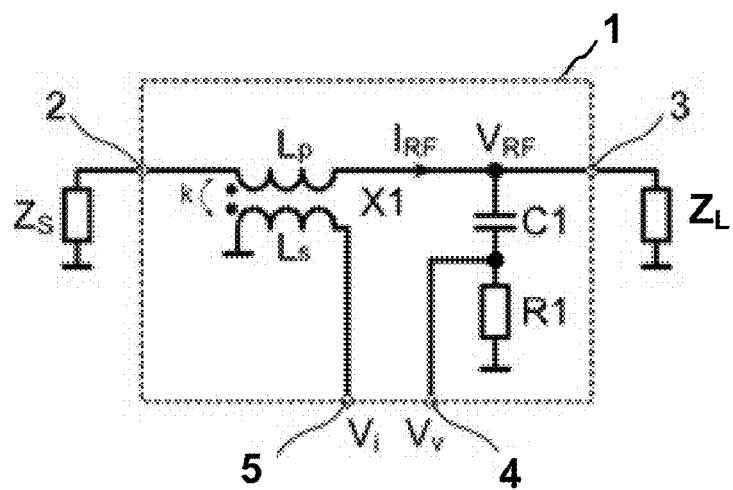
FIG. 1*a* illustrates an example coupling circuit.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a directional coupler that may be used in RF circuits to measure incident or reflected power. Embodiments of the present invention may also be applied to other systems and applications including other circuits that utilize phase detectors such as phase-lock loop (PLL) circuits and power detectors. Moreover embodiment may be directed to systems that make RF measurements including, but not limited to devices that measure and/or tune impedance mismatch, time domain reflectometers (TDR), sensing devices for use with tunable antenna matching circuits, and tunable filters.

In an embodiment of the present invention, an impedance measurement device includes a phase-shift network coupled to transformer having a primary winding and secondary winding. The primary winding of the transformer is coupled in series with a transmission path of the impedance measurement device. The secondary winding of the transformer and the phase shifter is loaded by high-impedance measurement device that determines the quality of the impedance match and/or the absolute or relative magnitude and/or phase of an incident and/or reflected signal between ports of the transmission path.

In an embodiment, information about the amplitude and phase of current and voltage of the RF signal is extracted and compared with a predefined value, such as, but not limited to a 50Ω impedance. The relationship between the extracted amplitudes and phases of the RF current and voltage indicates the amount of reflection in the RF signal path and therefore indicates the load impedance. For example, the smaller the reflection, the closer the load impedance is to the characteristic impedance $Z_0$:

$$Z_L = Z_0 \frac{1+\Gamma_0}{1-\Gamma_0},$$

where $Z_L$ represents load impedance, $Z_0$ represents the characteristic impedances, which may be 50Ω Ohms, and $\Gamma_0$ represents the reflection coefficient. In some embodiments, a magnetic transformer generates a voltage proportional to a RF current and an RC network generates voltage proportional to a RF voltage. In some embodiments, the coupler is constructed such that amplitudes and phases of the voltage proportional to the RF current and the voltage proportional to the RF voltage are 180 degrees out of phase and have the same amplitude when there is no reflection in the RF signal path.

Referring to FIG. 1a, the coupler 1 is a four-port device with ports 2 and 3 being the 50-Ohm ports for RF signal and two coupled ports 4 and 5 loaded with a high impedance. Coupler 1 includes transformer X1 with primary winding Lp coupled between source impedance $Z_S$ and load impedance $Z_L$. A phase-shifting network implemented by a high-pass RC filter that includes resistor $R_1$ and capacitor $C_1$ is coupled to the port 3. Using the equation for an ideal transformer that is loaded with a high impedance the voltage at port 5 can be expressed as:

$$V_i = -j\omega \cdot k\sqrt{L_p L_s} \cdot I_{RF}, \tag{1}$$

where $L_p$, and $L_s$ are the self-inductance of primary and secondary windings of transformer X1, and k is a coupling factor between primary and secondary windings of X1.

The voltage Vv at port 4 can be expressed as:

$$V_v = \frac{j\omega R_1 C_1}{j\omega R_1 C_1 + 1} \cdot V_{RF} \tag{2}$$

When the cut-off frequency of the RC network is well above the operating frequency range of the coupler, namely $$\omega \ll \frac{1}{R_1 C_1}, \tag{3}$$

equation (2) may be approximated as follows:

$$V_v \approx j\omega R_1 C_1 \cdot V_{RF}. \tag{4}$$

In an embodiment, the various components and parameters k, $L_P$, $L_S$, $R_1$ and $C_1$ are chosen to meet the following condition:

$$\frac{k\sqrt{L_p L_s}}{R_1 C_1} = Z_0, \tag{5}$$

where $Z_0$ is a reference impedance. In some embodiments, $Z_0$ may be set to the characteristic impedance of the system, which may be, for example, 50Ω, or another impedance. If load impedance $Z_L$ for the RF signal at port 3 is equal to the reference impedance $Z_0$, than from equations (1), (4) and (5) it follows that $$V_v + V_i = 0 \tag{6a}$$

because $|V_v| = |V_i|$ and $\angle V_v - \angle V_i = 180°$. In the case of an impedance mismatch, for example, when $Z_L \neq Z_0$, $$V_v + V_i \neq 0 \tag{6b}$$

Figure 1B:
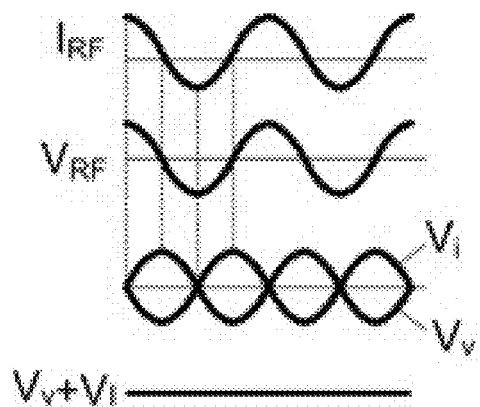
FIGS. 1*b* and 1*c* illustrate voltage and current waveforms associated with the example coupling circuit.
Figure 1C:
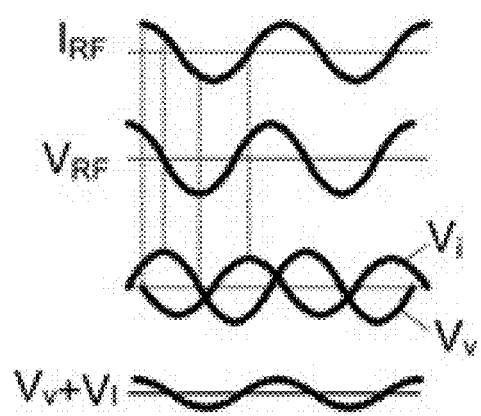

FIGS. 1b and 1c include waveform diagrams that illustrate the relationship between voltages Vi and Vv under matched impedance conditions and mismatched impedance conditions with respect to the circuit of FIG. 1a. FIG. 1b illustrates a waveform diagram showing the relationship between the input and output currents measurement output voltages of an embodiment coupler under matched impedance conditions. As shown, current $I_{RF}$ and voltage $V_{RF}$ are in-phase with each other with relative amplitudes that follow the following relationship:

$$\frac{V_{RF}}{I_{RF}} = Z_0.$$

Consequently, voltages Vi and Vv at port 5 and port 4, respectively have equal amplitudes and are 180 degrees out of phase with each other such that the sum of Vi and Vv is zero and/or is a DC voltage. In some embodiments, the node at port 5 that produces Vi may be referred to as a current measurement node, and the node at port 4 that produces Vv may be referred to as a voltage measurement node.

FIG. 1c illustrates a waveform diagram showing the relationship between the input and output currents measurement output voltages of an embodiment coupler under mismatched impedance conditions. As shown, current $I_{RF}$ and voltage $V_{RF}$ are out of phase with each other with relative amplitudes in which:

$$\frac{V_{RF}}{I_{RF}} \neq Z_0.$$

Under this condition, voltages Vi and Vv at port 5 and port 4, respectively have unequal amplitudes and are not 180 degrees out of phase with each other. Therefore, the sum of Vi and Vv has an AC component. It should be understood that the sum of Vi and Vv may have an AC components in conditions in which Vi and Vv are in phase with each other but have unequal amplitudes, or under conditions in which Vi and Vv are out of phase with each other but have equal amplitudes. In alternative embodiments, the amplitudes and phases of Vi and Vv may be scaled such an unequal amplitude condition and/or an out of phase condition represents a matched impedance conditions. This could occur, for example, in implementations that utilize phase shift networks that do not produce a 90° phase shift, amplitude scaling networks that produce non-equal amplitudes at matched conditions, embodiments that omit analog phase shift networks. Such embodiments may occur due to the presence of device parasitics and/or may result in situations where component values and parameters are constrained to make a 90° phase shift and matched amplitude for Vi and Vv under matched impedance conditions impractical. In such embodiments, the requisite scaling and phase shift needed to determine a matched impedance condition may be performed during post-processing in the analog or digital domain.

Embodiment couplers and impedance mismatch measurement circuits may be used to monitor incident and reflected RF power. Referring to FIG. 1a, if port 2 is considered an input port and port 3 is a transmission port then the sum of signals Vv and Vi will indicate the reflected power such that the difference between Vv and Vi is proportional to incident power. For example:

$$V_{RF} = V_{RF}^+ + V_{RF}^- \tag{7}$$

$$I_{RF} = I_{RF}^+ - I_{RF}^- = \frac{V_{RF}^+}{Z_0} - \frac{V_{RF}^-}{Z_0}, \tag{8}$$

where $V_{RF}^+$ and $I_{RF}^+$ are incident voltage and current, $V_{RF}^-$ and $I_{RF}^-$ are the reflected voltage and current. Substituting (7) and (8) into (1) and (4) results in:

$$V_i = -j\omega \cdot k\sqrt{L_p L_s} \cdot \frac{V_{RF}^+}{Z_0} + j\omega \cdot k\sqrt{L_p L_s} \cdot \frac{V_{RF}^-}{Z_0}, \quad (9)$$

and $$V_v \approx j\omega R_1 C_1 \cdot V_{RF}^+ + j\omega R_1 C_1 \cdot V_{RF}^-. \quad (10)$$

According to (5):

$$\frac{k\sqrt{L_p L_s}}{R_1 C_1} = Z_0 \Rightarrow \frac{k\sqrt{L_p L_s}}{Z_0} = R_1 C_1 \quad (11)$$

Substituting (11) into (9) results in:

$$V_i = -j\omega \cdot R_1 C_1 \cdot V_{RF}^+ + j\omega \cdot R_1 C_1 \cdot V_{RF}^- \quad (12)$$

Finally, by adding and subtracting voltages, as shown in equations (10) and (12), reflected and incident power in the RF line can be monitored as follows:

$V_v + V_i = 2j\omega \cdot R_1 C_1 \cdot V_{RF}^- \Rightarrow$ reflected wave monitoring $V_v - V_i = 2j\omega \cdot R_1 C_1 \cdot V_{RF}^+ \Rightarrow$ incident wave monitoring.

If the input and transmitted ports of the coupler are swept such that port 3 is considered an input port and port 2 is considered a transmission port, then the sum of signals Vv and Vi indicates the incident power and difference between Vv and Vi indicates the reflected power.

Figure 1D:
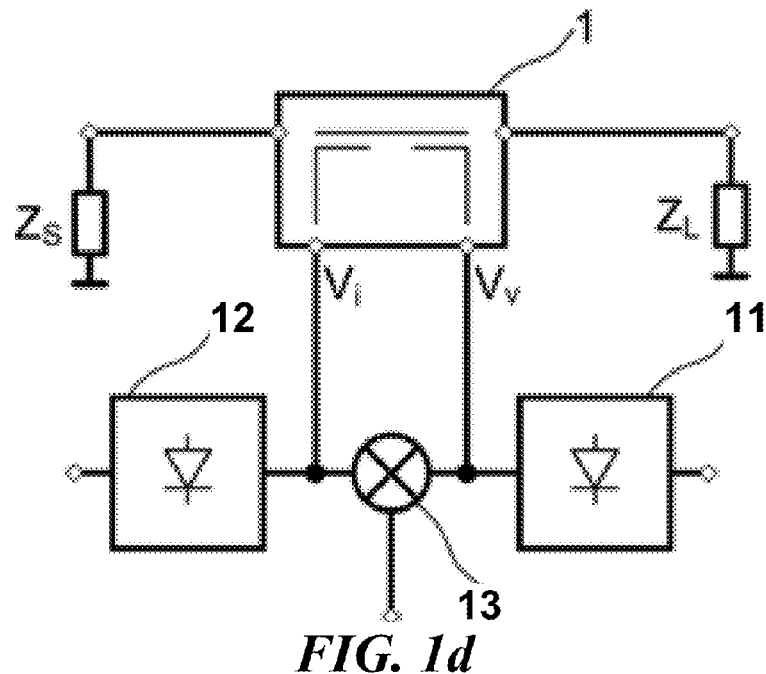
FIG. 1*d* illustrates an embodiment reflection measurement circuit.

FIG. 1d illustrates an embodiment reflection measurement circuit having embodiment coupler 1 that is coupled to power detectors 11 and 12. Power detectors 11 and 12 produce a value proportional to a current and voltage portion of the RF signal while the phase detector 13 detects the phase difference between the Vi and Vv. In matched conditions, the outputs of both detectors are equal to each other and the phase difference between signals is 180°. In some cases, phase detector 13 may be implemented using circuits and systems known in the art. For example, phase detector 13 may be implemented using an exclusive-or (XOR) gate, an analog mixer, a digital latch circuit, or using other circuits and methods known in the art.

Figure 1E:
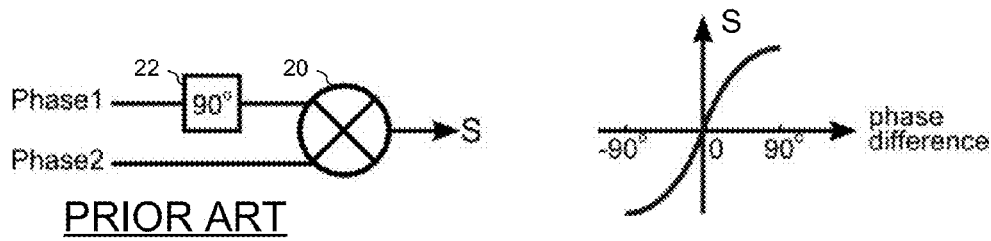
FIGS. 1*e* and 1*f* illustrate conventional phase detector circuits.

In the case of an analog mixer, phase shifted versions of the signals Phase1 and Phase2 to be detected are applied to the input of a mixer 20 to produce detection signal S via quadrature mixing, as shown in FIG. 1e. Phase1 is phase shifted by 90° using a phase shift circuit 22 such as a polyphase filter. As shown, the output signal v. phase difference characteristic that provides a variable output for phase differences from −90° to +90°. Limiting factors to the performance of the analog mixer may include the accuracy and bandwidth of phase shift circuit 22.

Figure 1F:
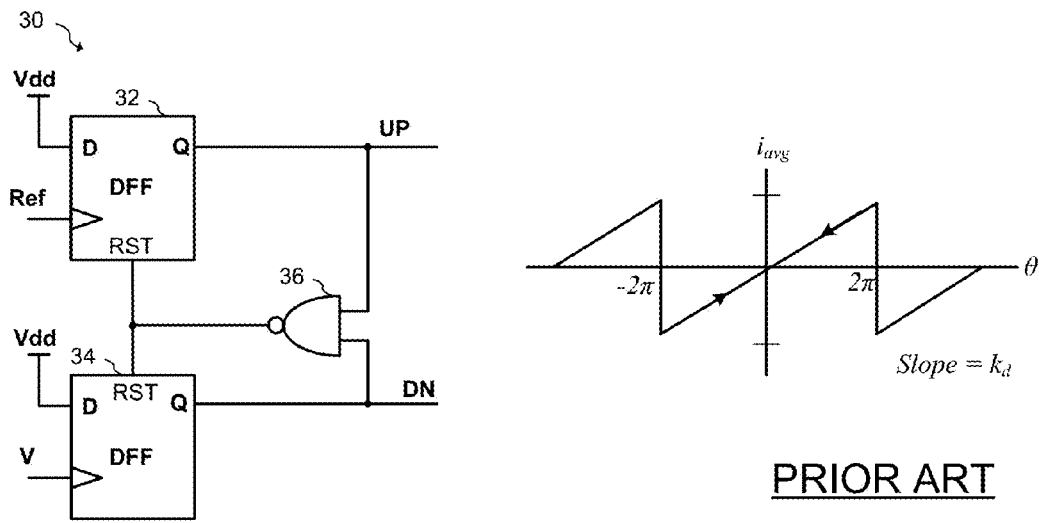

Another example of a phase detector is digital phase detector circuit 30 shown in FIG. 1f that includes two D-type flip-flops 32 and 34 and logic gate 36. This type of phase detector is commonly used in conjunction with a charge pump (not shown) that produces a charging current when signal UP is high and produces a discharging current when signal DN is high. As shown in the accompanying graph, the average charge pump current $i_{avg}$ is proportional to the phase difference between input signals Ref and V for phase differences between −2π(−360°) and +2π(−360°). Phase detector circuit 30 is commonly used in phase locked loops to control a frequency of a RF oscillator. Because phase detector 30 typically operates on a divided frequency signal, the actual operation of phase detector circuit 30 is commonly at a much lower frequency than the oscillation frequency of the RF oscillator. As the operation frequency of phase detector 30 increases up toward RF frequencies, larger input amplitudes may be needed to change the state of D-type flip-flops 32 and 34.

Figure 2A:
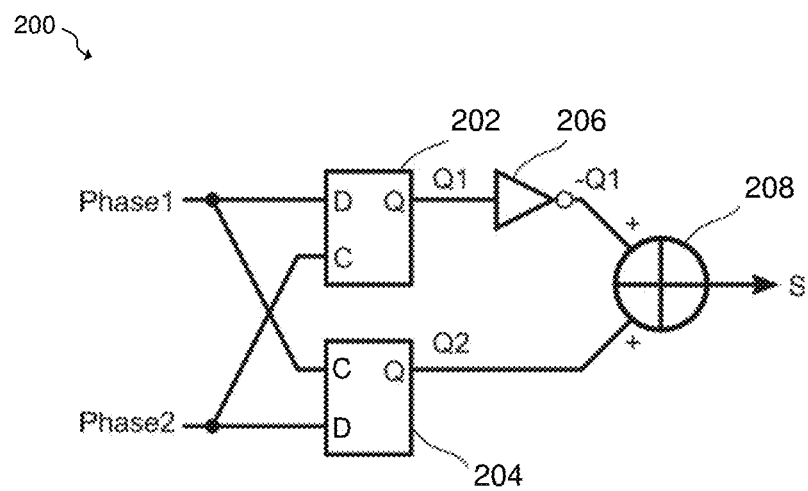
FIGS. 2*a-g* illustrate schematics and waveform diagrams of embodiment phase detectors.

FIG. 2a illustrates a phase detector 200 according to an embodiment of the present invention. Phase detector 200 includes a first gated latch 202, a second gated latch 204, an inverter 206 that inverts the output of first gated latch 202, and an adder 208 that adds the inverse output of first gated latch 202 to the output of second gated latch 204. In an embodiment, gated latches 202 and 204 are transparent for high level at the clock "C" input (Q=D) and store the state for low level at clock "C" input (Q=last D). Alternatively, gated latches 202 and 204 may be implanted having inputs and outputs that are activated or asserted using different polarities.

Figure 2B:
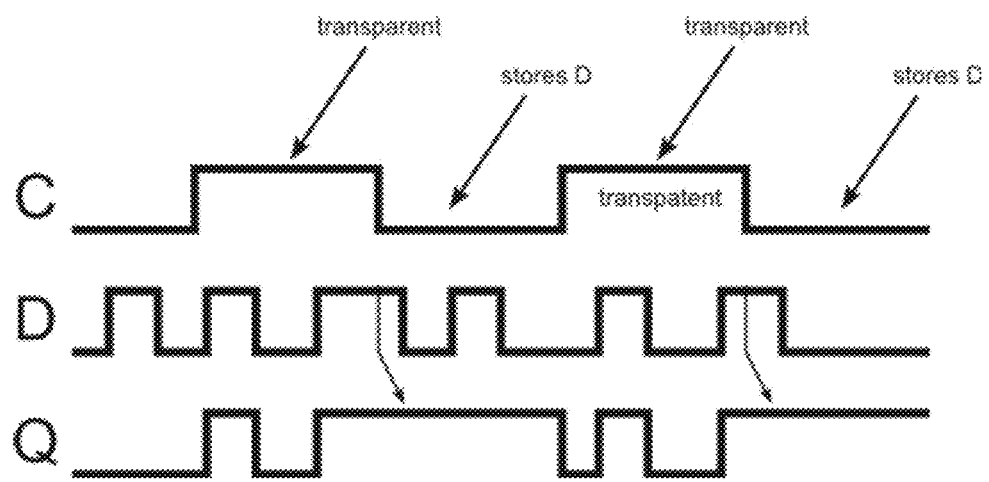

FIG. 2b illustrates a waveform diagram that demonstrates the operation of an embodiment gated latch. As shown, when the clock "C" input is high, the gated latch is in a transparent state and output "Q" of the gated latch follows data input "D" of the gated latch. When clock "C" input is low, however, the gated latch is in a latched state and the previous value of data input "D" is held at output "Q" of the gated latch.

Figure 2C:
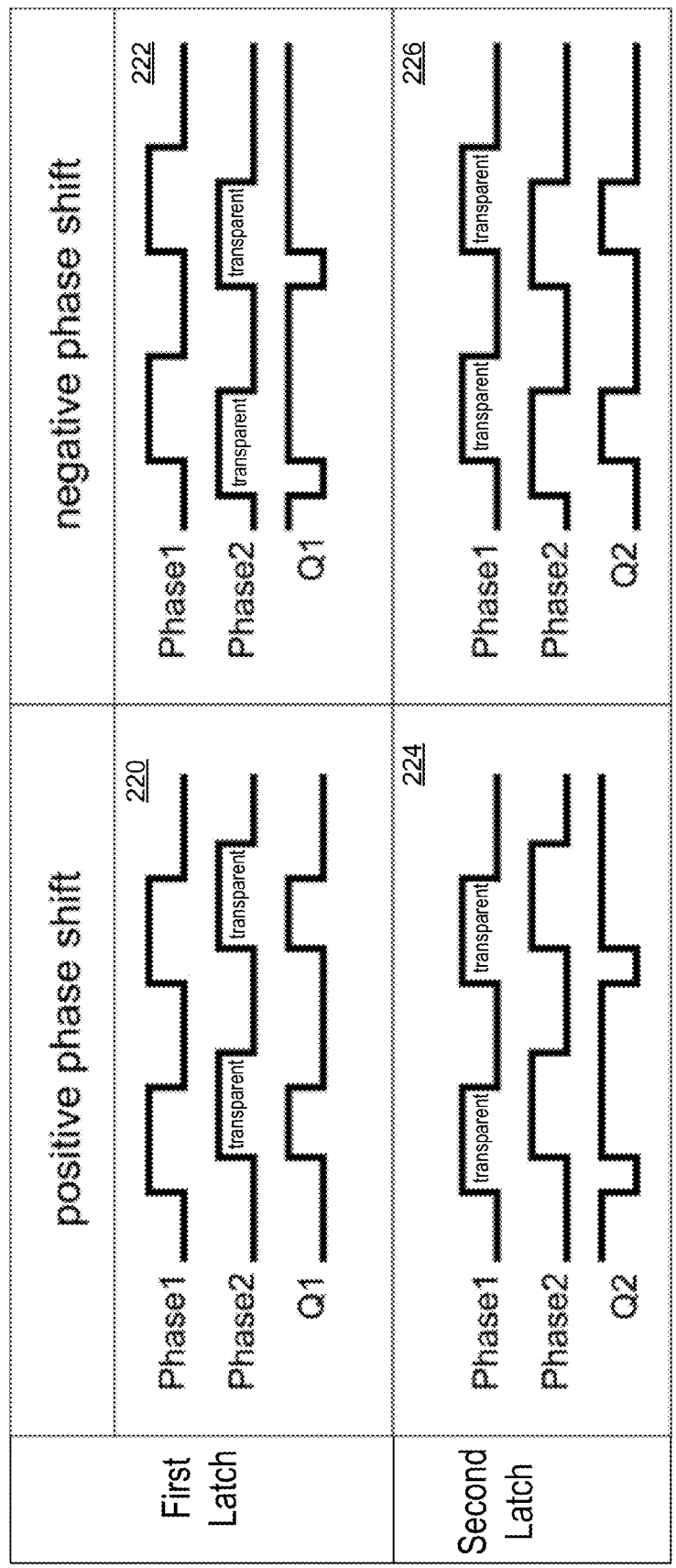

FIG. 2c illustrates waveform diagrams showing the operation of first gated latch 202 and second gated latch 204 during various operational situations. Waveform diagram 220 shows the case in which signal Phase2, which is coupled to the clock "C" of gated latch 202, leads the signal Phase1, which is coupled to the data "D" input of gated latch 202; and waveform diagram 222 shows the case in which signal Phase2 lags signal Phase1. As shown, output Q1 of first gated latch 202 has a small duty cycle when Phase2 leads Phase1 in waveform diagram 220, and Q1 has a large duty cycle when Phase2 lags Phase1. Similarly, waveform diagram 224 shows the case in which signal Phase2, which is coupled to the data "D" of second gated latch 204, leads the signal Phase1, which is coupled to the clock "C" input of second gated latch 204; and waveform diagram 226 shows the case in which signal Phase2 lags signal Phase1. As shown, latch output Q2 of second gated latch 205 has a large duty cycle when Phase2 leads Phase1 in waveform diagram 224, and Q2 has a small duty cycle when Phase2 lags Phase1.

Figure 2D:
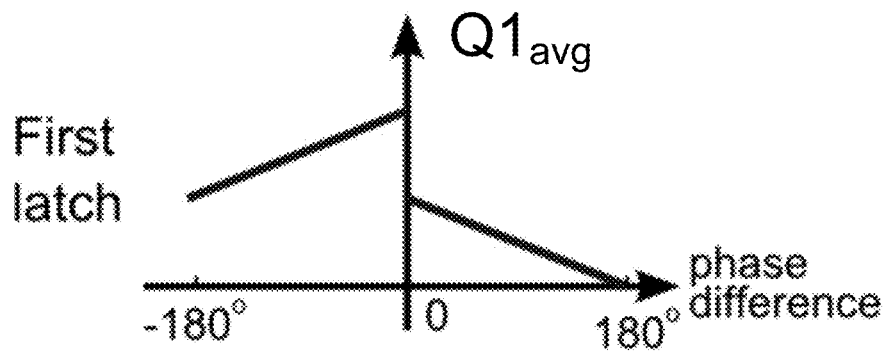
Figure 2E:
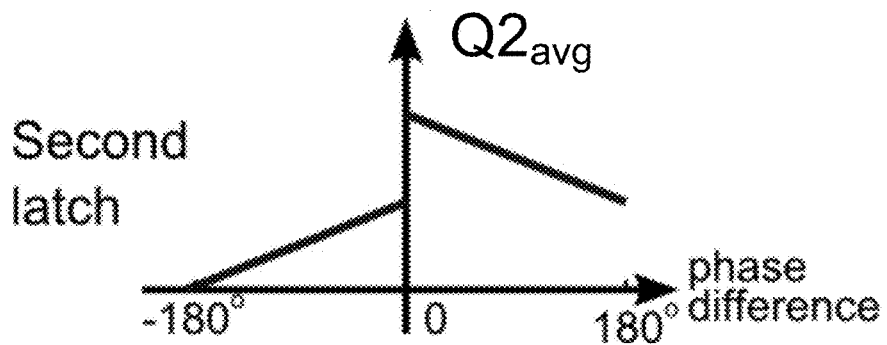
Figure 2F:
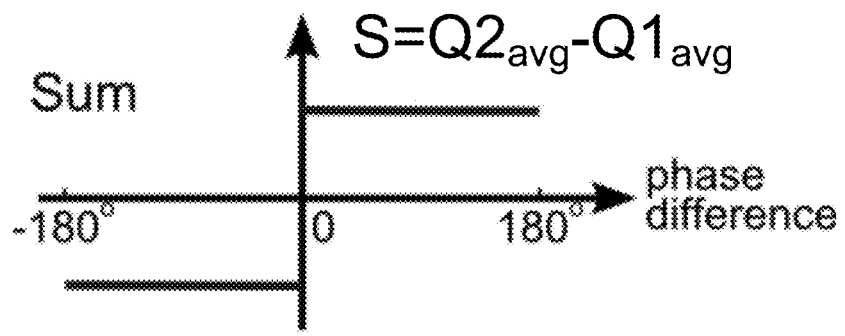

FIG. 2d illustrates a graph of the average value $Q1_{avg}$ of output Q1 of first gated latch 202 as the phase difference between signal Phase1 and Phase2 varies from −180° to +180°. As shown, the value of $Q1_{avg}$ increases as the phase difference increases from −180° to 0°. At a phase difference of 0°, the value of $Q1_{avg}$ abruptly changes to a lower value, and then decreases further at the phase difference approaches +180°. Similarly, FIG. 2e illustrates a graph of the average value $Q2_{avg}$ of output Q2 of second gated latch 204 as the phase difference between signal Phase1 and Phase2 varies from −180° to +180°. As shown, the value of $Q2_{avg}$ increases as the phase difference increases from −180° to 0°. At a phase difference of 0°, however, the value of $Q2_{avg}$ abruptly increases to a higher value, and then decreases at the phase difference approaches +180°. When the values of $Q2_{avg}$ and $Q2_{avg}$ are summed such that $S=Q2_{avg}-Q1_{avg}$, it can be seen that S has a low value at phase differences of less than 0° and a high value a phase differences of greater than 0° after an abrupt change when the phase difference crosses 0°. In the embodiment shown, S has a constant low value for phase differences less than 0°, and a high constant value for phase differences greater than 0°.

Figure 2G:
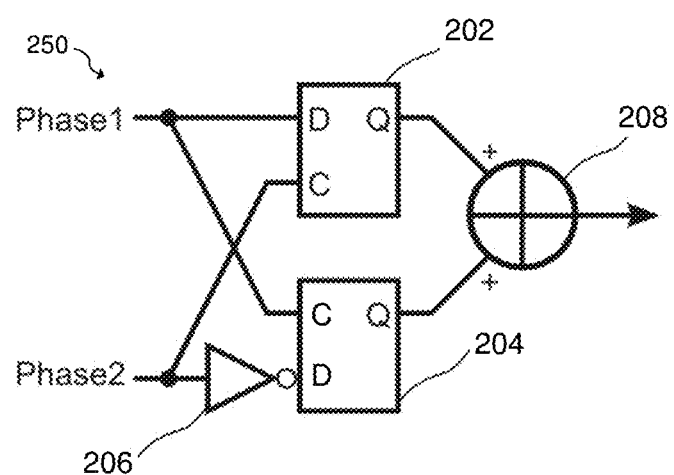

In alternative embodiments, phase detector 200 shown in FIG. 2a may be modified to produce other mathematically equivalent structures, one example of which is phase detector 250 shown in FIG. 2g. Here, inverter 206 is coupled between signal Phase2 and clock "C" input of second gated latch 204 instead of between output "Q" of first gated latch 202 and the input of adder 208. It should be appreciated that other mathematically similar or equivalent structures may also be used in other embodiments. Adder 208 can be implemented using various structures known in the art, including, but not limited to OpAmp-based voltage adders, resistive adders and other adder circuits. In some embodiments, adder 208 is configured to perform a filtering function to suppress the high-frequency components after the latch, thereby bypassing the DC component of output signal.

Figure 3:
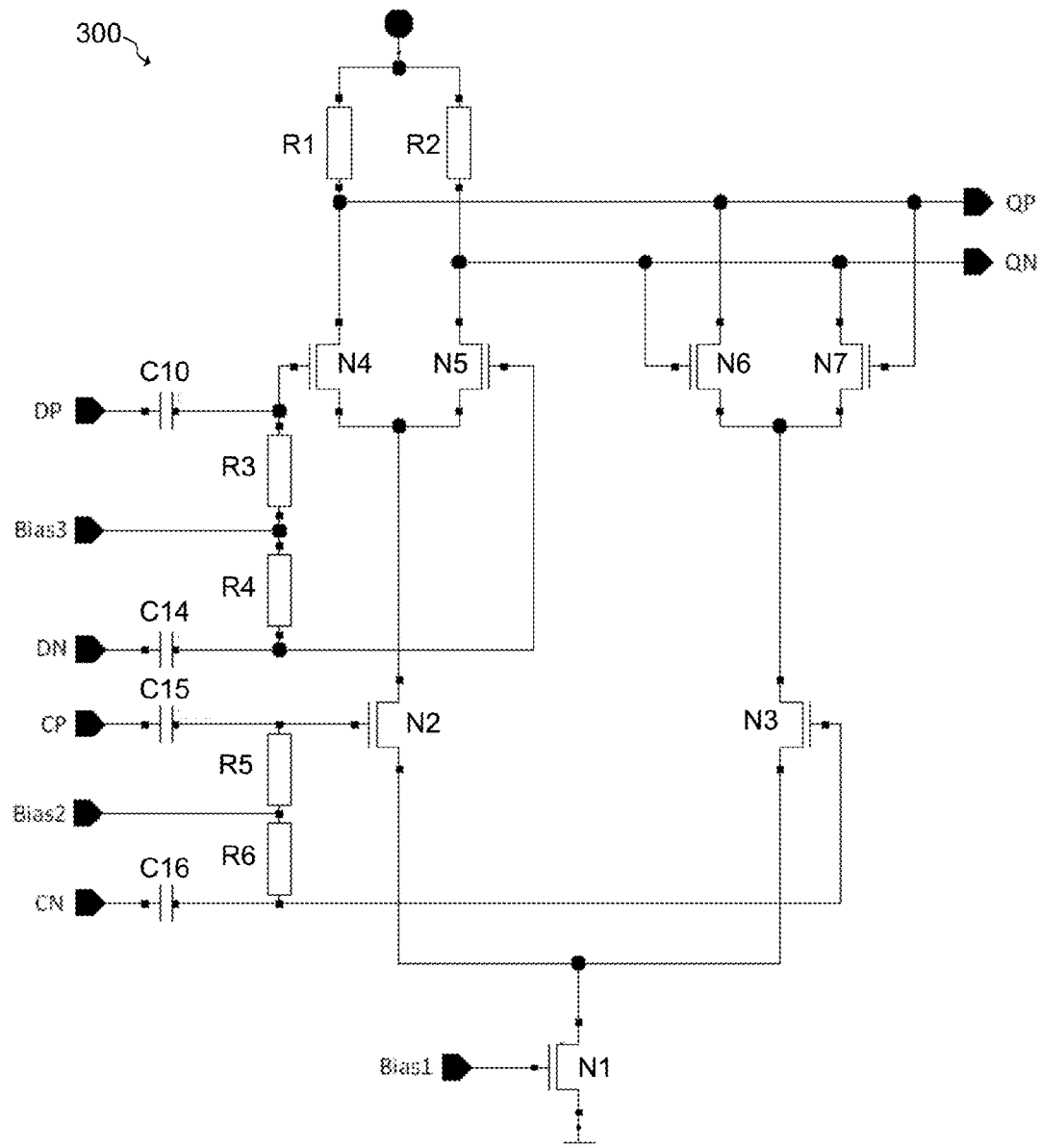
FIG. 3 illustrates a schematics an embodiment latch circuit.

FIG. 3 illustrates a schematic of an embodiment gated latch 300 that is implemented using a fully-differential current-mode structure. As shown, gated latch 300 includes a first differential pair of NMOS transistors N2 and N3 having coupled to differential clock inputs CP and CN; a second differential pair of NMOS transistors N4 and N5 coupled to differential data inputs DP and DN, and a third differential pair of NMOS transistors N6 and N7 having gates that are cross coupled to outputs QP and QN of gated latch 300. Load resistors R1 and R2 develop an output voltage based on the current output of transistors N4, N5, N6 and N7; resistors R3 and R4 are used to bias the gates of NMOS transistors N4 and N5 to bias voltage Bias3; and resistors R5 and R6 are used to bias the gates of NMOS transistors N2 and N3 to bias voltage Bias2. Voltages Bias2 and Bias3 may be generated using a biasing circuits and methods known in the art. For example, voltage Bias3 may be generated using a high-ohmic resistor divider coupled between output nodes QP and QN. The tail current of first differential pair made of transistors N2 and N3 is developed by NMOS transistor N1 whose gate terminal biased by bias voltage Bias1 using bias circuits and methods known in the art. Inputs DP, DN, CP and CN are AC coupled to the inputs of gated latch 300 using DC blocking capacitors C10, C14, C15 and C16, respectively.

Latch 300 may be operated in a transparent mode and in an hold mode. The transparent mode is activated when the voltage at the gate of NMOS transistor N2 is greater than the voltage at the gate of NMOS transistors N3. During the transparent mode, the first differential pair of NMOS transistors N2 and N3 directs bias current to the second differential pair of NMOS transistors N4 and N5. As such, the state of output nodes QP and QN are directly affected by data inputs DP and DN. For example, if the voltage at the gate of NMOS transistor N4 is greater than the voltage at the gate of NMOS transistor N5, output QP has a lower voltage than output QN. During the hold mode, the first differential pair of NMOS transistors N2 and N3 directs bias current to the third differential pair of NMOS transistors N6 and N7. Consequently, the cross-coupled third differential pair of NMOS transistors N6 and N7 hold the last state. For example, If the voltage at node QP was higher than the voltage at node QN in the previous state, NMOS transistor N7 is turned on, thereby causing current to flow though NMOS transistor N7 and resistor R2 and pulling node QN low. When bias current is redirected to NMOS transistor N7 instead of NMOS transistor N6, node QN is maintained at the lower voltage via resistor R2, and node QP is remains at the higher voltage via resistor R2 and continues to hold node QP high. Thus, outputs QP and QN are latched.

In some embodiments, inverting functions, such as those implemented by inverter 206 shown in FIGS. 2a and 2g, may be implemented by swapping phases of the various differential signals within latch circuit 300. For example, the output of latch 300 may be inverted by swapping outputs QP and QN, and the clock inputs may be inverted by swapping inputs CP and CN. In such differential embodiments, the inverting function may be implemented without additional circuitry. Moreover, latch circuit 300 may be configured to operate at high frequencies into the GHz range with input signals having amplitudes that are well below the supply voltage.

While NMOS transistors are used in the embodiments of FIG. 3, it should be appreciated that other device types, such as PMOS transistors, bipolar transistors and JFETs may be used to implement the mixers and amplifiers. It should be further appreciated that the latch 300 illustrated in FIG. 3 is just one of many examples of embodiment latches. Alternatively the structure shown in FIG. 3 may be modified and/or a different structure known in the art may be used.

Figure 4A:
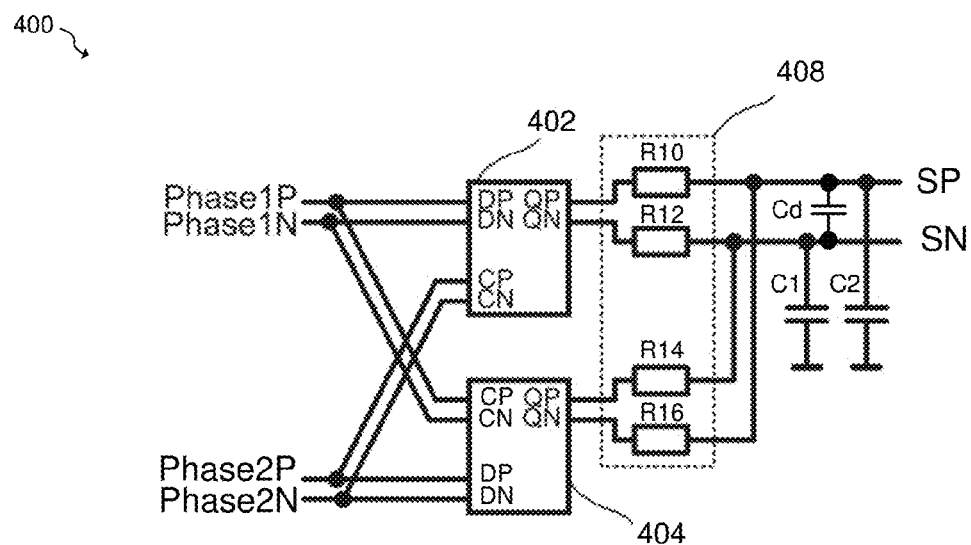
FIGS. 4*a-b* illustrate a schematic and a waveform diagram an embodiment phase detector.

FIG. 4a illustrates an embodiment phase detector 400 that utilizes differential gated latches, such as latch 300 shown in FIG. 3. Phase detector 400 includes first differential gated latch 402 and second differential gated latch 404 that is followed by resistive adder 408 and output filtering capacitors C1 and C2. In some embodiments differential filtering capacitor Cd may be used instead of or in addition to capacitors C1 and C2. As shown, there are no external inverting circuits, since embodiment inverting functions are implementing by the selection of inputs and outputs or first differential gated latch 402 and second differential gated latch 404. Resistive adder 408 includes resistors R10, R12, R14 and R16 that are coupled between differential latches 402 and 404 and capacitors C1 and C2 as shown. A filtered differential sum output is taken at nodes SP and SN. Resistors R10, R12, R14 and R16 have a value of about 10 KΩ and the values of capacitors C1 and C2 are several pF. In some embodiments, resistors R10, R12, R14 and R16 are chosen to be about 10× larger than load resistors within differential latch circuits 402 and 404. These load resistors may, for example, correspond to resistors R1 and R2 shown in FIG. 3. In one specific embodiment the low pass filter formed by resistors R10, R12, R14 and R16 and capacitors C1 and C2 have a bandwidth of between about 10 MHz and about 100 MHz in embodiments in which the input signals are operating above 500 MHz. In some embodiments, the amplitude of signals Phase1P, Phase1B, Phase2P and Phase2N are about ten times lower than the power supply voltage. It should be appreciated that alternative embodiments may operate over different frequency ranges from those described herein, and the illustrated circuits may correspondingly different component values and scaling factors from those described herein.

Figure 4B:
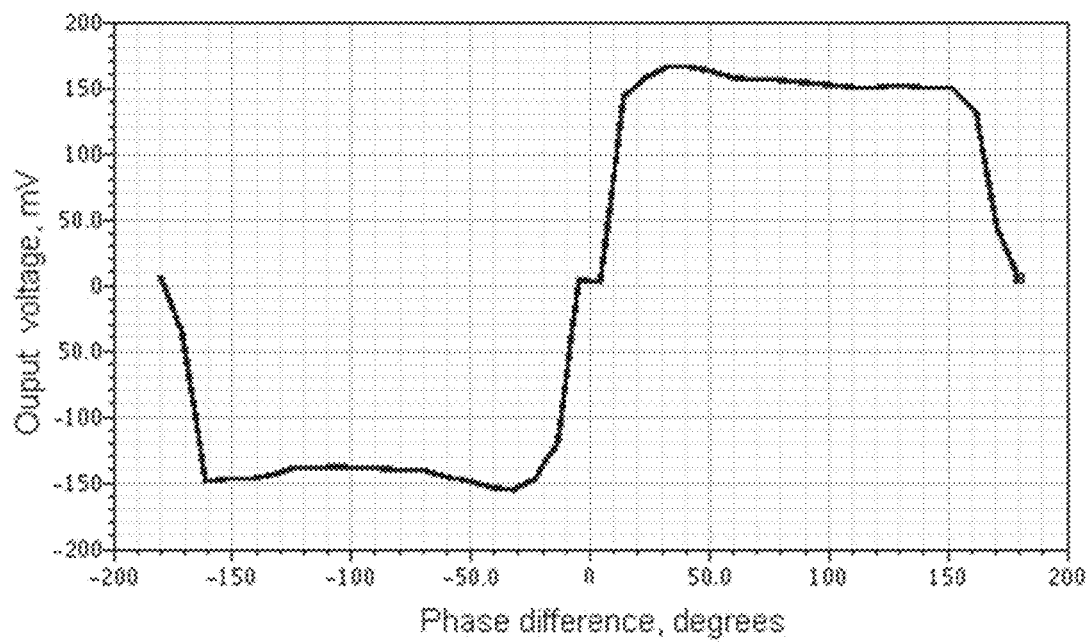

FIG. 4b illustrates a waveform plot that illustrates the output voltage versus phase difference characteristic of the circuit of FIG. 4a. As shown, the output voltage is about −150 mV when the input phase difference is less than zero degrees and about +150 mV when the input phase difference is greater than 150 mV. As is apparent from FIG. 4a, there is about 5° of dead zone at about 0°. It should be understood, however, that other embodiments may perform differently from what is illustrated in FIG. 4b. In some embodiments, phase detector 400 may be operated at high frequencies in the GHz range. In addition, the frequency of operation may be varied over a large frequency range while detection accuracy is maintained.

In some embodiments, a phase detector may be implemented using logarithmic amplifiers according to increase its dynamic range. In some embodiments circuits and methods described in co-pending U.S. patent application Ser. No. 13/975,914 entitled, "System and Method for a Phase Detector" and filed on Aug. 26, 2013, which is incorporated by reference herein it its entirety, may be applied to embodiments herein.

Figure 5:
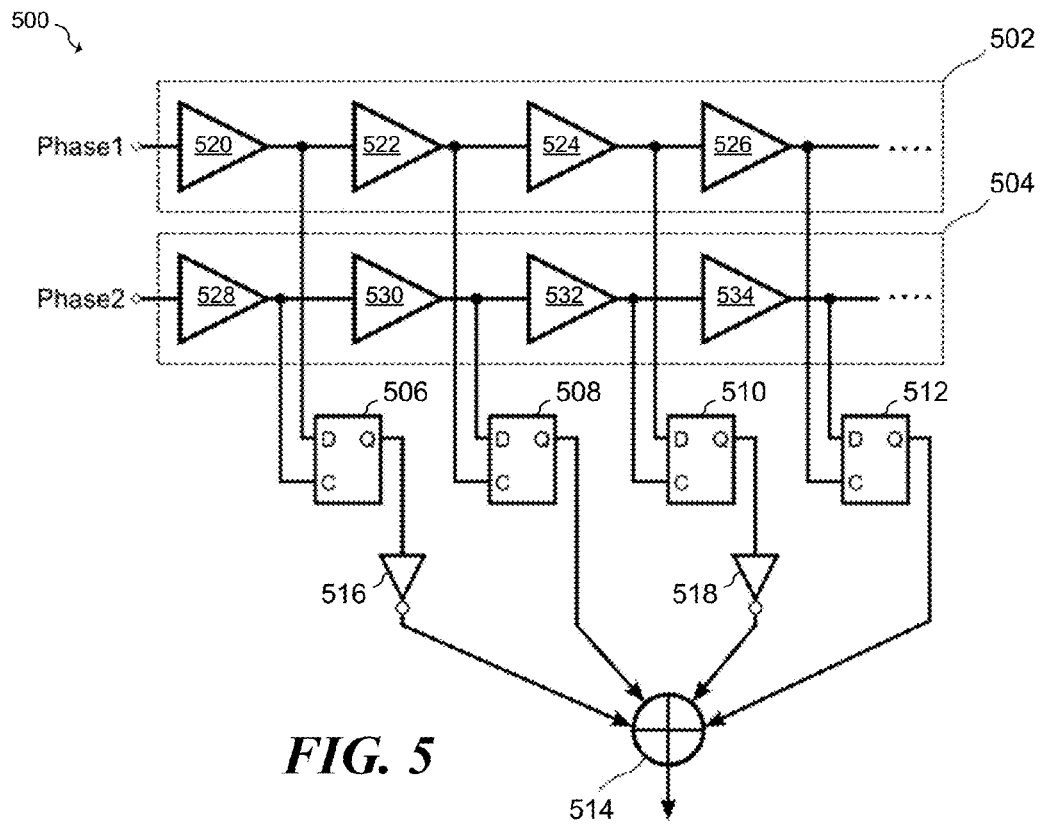
FIG. 5 illustrates an embodiment phase detector that incorporates logarithmic amplifiers.

In one example, two logarithmic amplifiers are implemented using cascades of linear amplifiers to produce a log-linear response, as illustrated in FIG. 5, which shows phase detector 500 according to an embodiment of the present invention. Here, two coherent RF signals are applied to two logarithmic amplifiers 502 and 504. Each logarithmic amplifier includes of n gain stages. In the illustrated embodiment, a logarithmic amplifier 502 has four amplifiers 520, 522, 524 and 526, and logarithmic amplifier 504 also has four amplifiers 528, 530, 532, and 534. Alternatively, greater or fewer gain stages may be used in each logarithmic amplifier such that n is greater than or equal to 2. Phase detection is performed by gated latches 506, 508, 510 and 512, each having two inputs D and C. Inputs of gated latches 506, 508, 510 and 512 are coupled to each stage of the logarithmic amplifiers in an interchangeable order: every odd stage of the logarithmic amplifier 502 is coupled to inputs D of the gated latches, while every even stage of the logarithmic amplifier 502 is coupled to inputs C of the gated latches. Likewise, every odd stage of logarithmic amplifier 504 is coupled to inputs C of the gated latches, while every even stage of logarithmic amplifier 504 is coupled to inputs D of the gated latches. Signals from all gated latches are summed up together with the adder 514 as described in embodiments above. In alternative embodiments, gated latches 506, 508, 510 and 512 may be coupled to the outputs of amplifiers 520, 522, 524, 526, 528, 530, 532, and 534 using various input polarities besides reversing the connections of every other mixer. For example, in some embodiments, two consecutive mixers may be coupled using a same polarity, mixers may be coupled to only a subset of amplifiers, or other combinations may be used.

In an embodiment, inverter 516 is coupled between the output of gated latch 506 and adder 514, and inverter 518 is coupled between the output of gated latch 506 and adder 514. Alternatively, inverters 516 may precede the clock inputs of gated latches 508 and 512 or may be placed in other positions in order to effect a mathematically similar or equivalent behavior as the embodiment shown in FIG. 5.

In some embodiments, logarithmic amplifiers 502 and 504 and gated latches may be implemented differentially. In such embodiments, the inversion functions provided by inverters 516 and 518 may be incorporated by selection of signal polarities as described herein. In such embodiments, separate circuits for inverters 516 and 518 may be unnecessary.

Figure 6A:
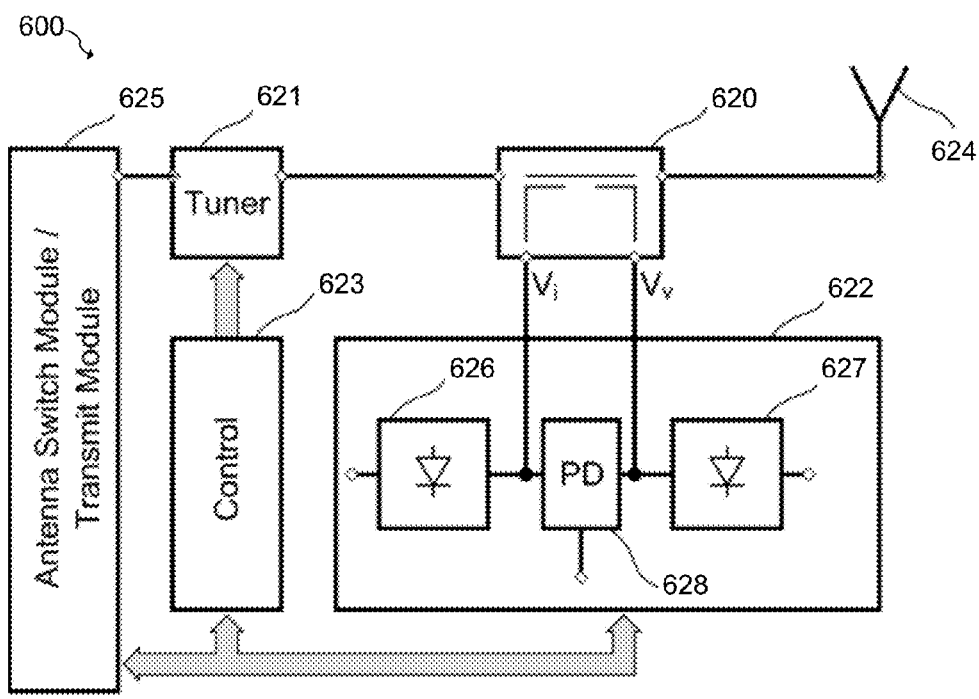
FIGS. 6*a-c* illustrate various embodiment RF systems that utilize embodiment phase detectors.
Figure 6B:
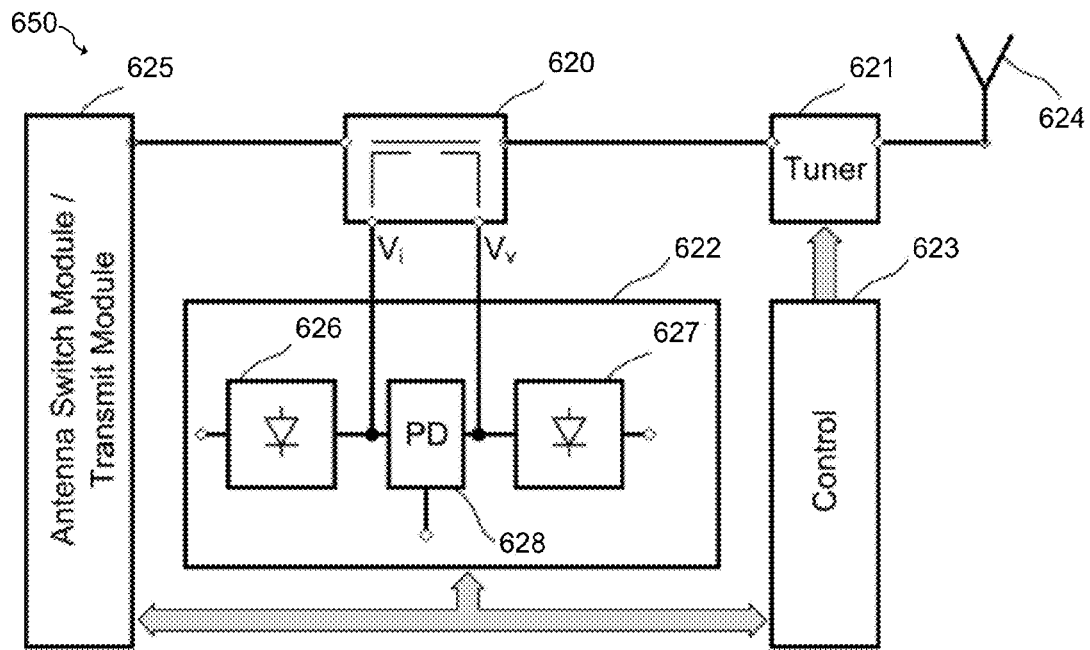
Figure 6C:
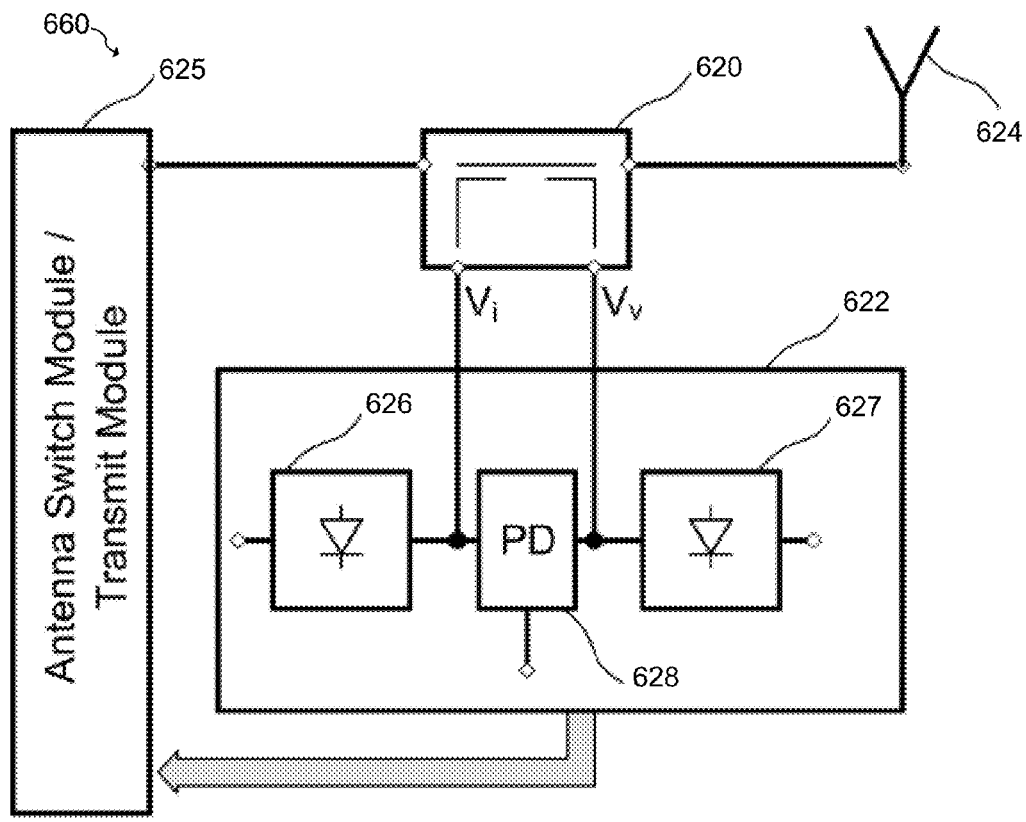

FIGS. 6a-c illustrate various embodiment systems that may incorporated embodiment phase detectors described herein. These systems may include, for example, a portion of an adaptive antenna tuning system in cellular handsets.

FIG. 6a illustrates RF system 600 that includes tuner 621 and a directional coupler 620 placed in the RF signal path between antenna switch/transmit module 625 and antenna 624. Directional coupler 620 extracts the current (Vi) and voltage (Vv) portions of the RF signal in the transmit path and passes them to the detector block 622 consisting of amplitude detectors 626 and 627 and a phase detector 628. Phase and amplitude detectors generate the DC signals proportional to amplitudes of RF current and voltage and phase difference between the RF current and voltage. In this way, the mismatch in the RF line may be detected and corrected by the tuner 621 controlled by controller 623. Controller 623 may include, for example various control circuitry such as a processor, microcontroller and/or dedicated logic, as well as interface circuitry such as A/D converters. Based on the information about phase and amplitude difference between the RF voltage and RF current provided by detectors 626, 627 and 628 the input impedance of the antenna 624 may be estimated and corrections can be applied by means of the tuner 621. Embodiment phase detectors described herein may be used to implement block 628 of the detector 622. RF system 600 may be implemented, for example, in the front end of a cellular telephone, wireless local area network transceiver, or other radio frequency system.

FIG. 6b illustrates another embodiment system 650 in which directional coupler 620 is coupled between the transmit module 625 and the tuner 621.

Embodiment phase detectors may also be used as a part of a RF mismatch detection system in a cellular handset as shown in FIG. 6. Here, mismatch detector 660 includes a directional coupler 620 coupled between the transmit module 625 and antenna 624 and a detector block 622. Detector block 622 includes two amplitude detectors 626 and 627 and embodiment phase detector 628 that may be implemented using proposed phase detector embodiments described herein.

It should be appreciated that the embodiment shown in FIGS. 6a-c are just three examples of the many embodiment systems that may be implemented using embodiment reflection measurement circuits utilizing embodiment phase detectors. Other example systems that may utilize embodiment reflection measurement circuits include power monitoring in planar inverted F antenna (PIFA) feed-point tuners. Embodiment phase detectors may be applied to other coupler and reflection measurement arrangements, such as those described in co-pending U.S. patent application Ser. No. 13/931,092 entitled, "System and Method for a Transformer and a Phase-Shift Network" and filed on Jun. 28, 2013, which is incorporated by reference herein it its entirety.

Figure 7:
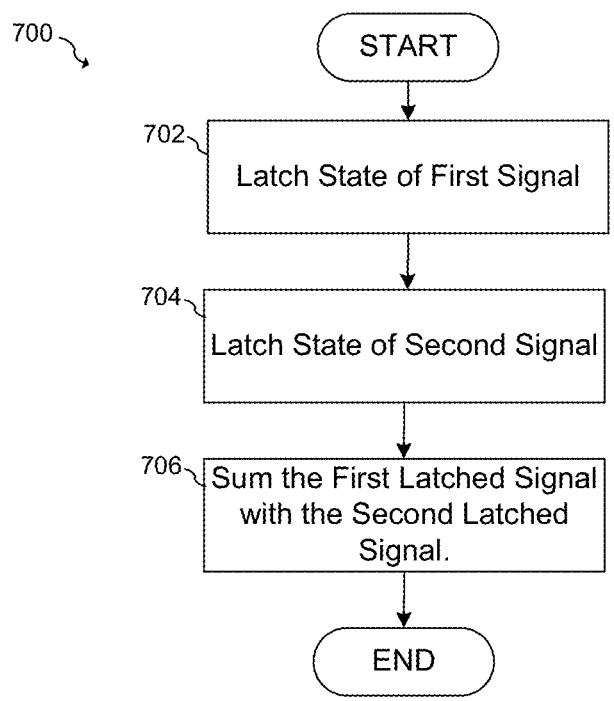
FIG. 7 illustrates a block diagram of an embodiment method.

FIG. 7 illustrates a block diagram 700 of an embodiment method of detecting a phase difference. In step 702, a first signal is latched using a first gated latch, and in step 704, a second signal is latched using a second gated latch. The outputs of the first and second gated latches are summed in step 706.

In accordance with an embodiment, a method of detecting a phase difference between a first signal and a second signal includes latching, using a first gated latch circuit, a state of the first signal using the second signal as a clock to produce a first latched signal; latching, using a second gated latch circuit, a state of the second signal using the first signal as a clock to produce a second latched signal; and summing the first latched signal and the second latched signal to produce an indication of whether the first signal is leading or lagging the second signal. In some embodiments, the second signal is inverted at a clock input of the second gated latch and/or the first latched signal is inverted prior to summing the first latched signal and the second latched signal. The step of summing may include low pass filtering the first latched signal and the second latched signal, and low pass filtering may, in some cases, include using a RC network.

In an embodiment, the method further includes providing the first signal and the second signal from outputs of a directional coupler. The method may further include detecting an amplitude of the first signal and an amplitude of the second signal.

In accordance with a further embodiment, a circuit includes a phase detector circuit having a first gated latch having a data input coupled to a first input of the phase detector and a clock input coupled to a second input of the phase detector; a second gated latch having a data input coupled to the second input of the phase detector and a clock input coupled to the first input of the phase detector; and a summing circuit having a first input coupled to an output of the first gated latch and a second input coupled to output of the second gated latch. An output of the summing circuit indicates whether a signal at the first input of the phase detector is leading or lagging a signal at the second input of the phase detector.

The first input of the summing circuit may be coupled to an inverted output of the first gated latch, and the second input of the summing circuit may be coupled to a non-inverted output of the second gated latch. In some embodiments, the phase detector further includes an inverter circuit coupled between the output of the first gated latch and first input of the summing circuit. The clock input of the second gated latch may be inverted with respect to the clock input of the first gated latch and/or the phase detector may further include an inverter circuit coupled between the second input of the phase detector and the clock input of the first gated latch.

In an embodiment, the summing circuit includes a first series resistor coupled to an output of the first gated latch, a second series resistor coupled to an output of the second gated latch, and a load capacitor coupled to the first series resistor and the second series resistor. The first gated latch and the second gated latch may each include a differential data input and a differential clock input. In some embodiments, the first gated latch and the second gated latch each include a first differential pair of transistors having control nodes coupled to the differential clock input, a second differential pair of transistors coupled to a first output of the first differential pair of transistors, such that the second differential pair of transistors having control nodes coupled to the differential data input, and a third differential pair of transistors coupled to a second output of the first differential pair of transistors. A control node of a first transistor of the third differential pair of transistors is coupled to an output node of a second transistor of the third differential pair of transistors, and a control node of the second transistor of the third differential pair of transistors is coupled to an output node of the first transistor of the third differential pair of transistors.

In an embodiment, the first differential pair of transistors includes a first differential pair of MOS transistors, the second differential pair of transistors comprises a second differential pair of MOS transistors, and the third differential pair of transistors comprises a third differential pair of MOS transistors. In some embodiments, the first gated latch and the second gated latch each further include a differential output, and the summing circuit includes a first resistor coupled between a first terminal of the differential output of the first gated latch and a first output of the summing circuit, a second resistor coupled between a second terminal of the differential output of the first gated latch and a second output of the summing circuit, a third resistor coupled between a first terminal of the differential output of the second gated latch and the second output of the summing circuit, and a fourth resistor coupled between a second terminal of the differential output of the second gated latch and the first output of the summing circuit. The summing circuit may further include a filter capacitor coupled between the first output of the summing circuit and the second output of the summing circuit. In some systems, the summing circuit further includes a first capacitor coupled between the first output of the summing circuit and a reference node, and a second capacitor coupled between the second output of the summing circuit and the reference node.

In an embodiment, the circuit includes a RF coupler having a first output coupled to the first input of the phase detector and a second output coupled to the second input of the phase detector. The circuit may further include first power detector coupled to the first input of the phase detector, and a second power detector coupled to the second input of the phase detector.

In accordance with further embodiments, a phase detector includes a plurality of cascaded RF stages, a first latch, a second latch and a summing circuit. Each of the plurality of cascaded RF stages has a first RF amplifier and a second RF amplifier. First RF amplifiers are cascaded with first RF amplifiers of successive RF stages and second RF amplifiers are cascaded with second RF amplifiers of successive RF stages. The first latch has a first input coupled to an output of a first RF amplifier of a first RF stage, and a second input coupled to an output of a second RF amplifier of the first RF stage; the second latch has a first input coupled to an output of a second RF amplifier of a second RF stage, and a second input coupled to an output of a first RF amplifier of the second RF stage; and the summing circuit has inputs coupled to outputs of the first latch and the second latch.

In some embodiments, the first input of the first latch is a data input and the second input of the first latch is a clock input and the first input of the second latch is a data input and the second input of the second latch is a clock input. The first latch may be implemented using a gated latch and the second latch may be implemented using a gated latch.

Advantages of some embodiments phase detectors include the ability to detect a polarity of phase between two signals at high frequencies without using a 90° phase shifter, as well as the ability to operate phase detector in the GHz range using submicron CMOS technologies. Another advantage includes the ability to determine a polarity of a phase difference over a wide frequency range.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of detecting a phase difference between a first signal and a second signal, the method comprising:
    latching, using a first gated latch circuit, a state of the first signal using the second signal as a clock to produce a first latched signal, wherein the first gated latch circuit is transparent when the second signal is asserted, and the first gated latch circuit stores a value of the first signal when the second signal is not asserted;
    latching, using a second gated latch circuit, a state of the second signal using the first signal as a clock to produce a second latched signal, wherein the second gated latch circuit is transparent when the first signal is asserted, and the second gated latch circuit stores a value of the second signal when the first signal is not asserted; and
    summing the first latched signal and the second latched signal to produce an indication of whether the first signal is leading or lagging the second signal.

2. The method of claim 1, further comprising inverting the second signal at a clock input of the second gated latch circuit.

3. The method of claim 1, further comprising inverting the first latched signal prior to summing the first latched signal and the second latched signal.

4. The method of claim 1, wherein summing comprises low pass filtering the first latched signal and the second latched signal.

5. The method of claim 4, wherein low pass filtering comprises using an RC network.

6. The method of claim 1, further comprising providing the first signal and the second signal from outputs of a directional coupler.

7. The method of claim 6, further comprising detecting an amplitude of the first signal and an amplitude of the second signal.

8. The method of claim 1, wherein the first gated latch circuit and the second gated latch circuit each comprise a differential data input and a differential clock input.

9. A circuit comprising a phase detector circuit, wherein the phase detector circuit comprises:
   a first gated latch having a data input coupled to a first input of the phase detector circuit and a clock input coupled to a second input of the phase detector circuit, wherein the first gated latch is transparent when the clock input of the first gated latch is asserted, and the first gated latch stores a value of the data input of the first gated latch when the clock input of the first gated latch is not asserted;
   a second gated latch having a data input coupled to the second input of the phase detector circuit and a clock input coupled to the first input of the phase detector circuit, wherein the second gated latch is transparent when the clock input of the second gated latch is asserted, and the second gated latch stores a value of the data input of the second gated latch when the clock input of the second gated latch is not asserted; and
   a summing circuit having a first input coupled to an output of the first gated latch and a second input coupled to an output of the second gated latch, wherein an output of the summing circuit indicates whether a signal at the first input of the phase detector circuit is leading or lagging a signal at the second input of the phase detector circuit.

10. The circuit of claim 9, wherein the first input of the summing circuit is coupled to an inverted output of the first gated latch, and the second input of the summing circuit is coupled to a non-inverted output of the second gated latch.

11. The circuit of claim 9, further comprising an inverter circuit coupled between the output of the first gated latch and the first input of the summing circuit.

12. The circuit of claim 9, wherein the clock input of the second gated latch is inverted with respect to the clock input of the first gated latch.

13. The circuit of claim 9, further comprising an inverter circuit coupled between the second input of the phase detector circuit and the clock input of the first gated latch.

14. The circuit of claim 9, wherein the summing circuit comprises:
   a first series resistor coupled to an output of the first gated latch;
   a second series resistor coupled to an output of the second gated latch; and
   a load capacitor coupled to the first series resistor and the second series resistor.

15. The circuit of claim 9, further comprising an RF coupler having a first output coupled to the first input of the phase detector circuit and a second output coupled to the second input of the phase detector circuit.

16. The circuit of claim 15, further comprising a first power detector coupled to the first input of the phase detector circuit, and a second power detector coupled to the second input of the phase detector circuit.

17. A circuit comprising a phase detector circuit, wherein the phase detector circuit comprises:
   a first gated latch having a data input coupled to a first input of the phase detector circuit and a clock input coupled to a second input of the phase detector circuit;
   a second gated latch having a data input coupled to the second input of the phase detector circuit and a clock input coupled to the first input of the phase detector circuit; and
   a summing circuit having a first input coupled to an output of the first gated latch and a second input coupled to an output of the second gated latch, wherein an output of the summing circuit indicates whether a signal at the first input of the phase detector circuit is leading or lagging a signal at the second input of the phase detector circuit, wherein the first gated latch and the second gated latch each comprise a differential data input and a differential clock input.

18. The circuit of claim 17, wherein the first gated latch and the second gated latch each comprise:
   a first differential pair of transistors having control nodes coupled to the differential clock input;
   a second differential pair of transistors coupled to a first output of the first differential pair of transistors, the second differential pair of transistors having control nodes coupled to the differential data input; and
   a third differential pair of transistors coupled to a second output of the first differential pair of transistors, wherein a control node of a first transistor of the third differential pair of transistors is coupled to an output node of a second transistor of the third differential pair of transistors, and a control node of the second transistor of the third differential pair of transistors is coupled to an output node of the first transistor of the third differential pair of transistors.

19. The circuit of claim 18, wherein,
   the first differential pair of transistors comprises a first differential pair of MOS transistors;
   the second differential pair of transistors comprises a second differential pair of MOS transistors; and
   the third differential pair of transistors comprises a third differential pair of MOS transistors.

20. The circuit of claim 17, wherein:
   the first gated latch and the second gated latch each further comprise a differential output; and
   the summing circuit comprises
      a first resistor coupled between a first terminal of the differential output of the first gated latch and a first output of the summing circuit,
      a second resistor coupled between a second terminal of the differential output of the first gated latch and a second output of the summing circuit,
      a third resistor coupled between a first terminal of the differential output of the second gated latch and the second output of the summing circuit, and
      a fourth resistor coupled between a second terminal of the differential output of the second gated latch and the first output of the summing circuit.

21. The circuit of claim 20, wherein the summing circuit further comprises:
   a filter capacitor coupled between the first output of the summing circuit and the second output of the summing circuit.

22. The circuit of claim 20, wherein the summing circuit further comprises:
   a first capacitor coupled between the first output of the summing circuit and a reference node; and
   a second capacitor coupled between the second output of the summing circuit and the reference node.

23. A phase detector comprising:
   a plurality of cascaded RF stages, each of the plurality of cascaded RF stages having a first RF amplifier and a second RF amplifier, wherein first RF amplifiers are cascaded with first RF amplifiers of successive RF stages and second RF amplifiers are cascaded with second RF amplifiers of successive RF stages;

a first latch having a first input coupled to an output of a first RF amplifier of a first RF stage, and a second input coupled to an output of a second RF amplifier of the first RF stage;

a second latch having a first input coupled to an output of a second RF amplifier of a second RF stage, and a second input coupled to an output of a first RF amplifier of the second RF stage; and a summing circuit having inputs coupled to outputs of the first latch and the second latch.

24. The phase detector of claim 23, wherein:

the first input of the first latch is a data input and the second input of the first latch is a clock input; and the first input of the second latch is a data input and the second input of the second latch is a clock input.

25. The phase detector of claim 23, wherein the first latch is a gated latch and the second latch is a gated latch.

* * * * *